United States Patent
Watanabe

(10) Patent No.: US 7,791,423 B2
(45) Date of Patent: Sep. 7, 2010

(54) TWO-FREQUENCY SWITCHOVER TYPE CRYSTAL OSCILLATOR

(75) Inventor: Makoto Watanabe, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 104 days.

(21) Appl. No.: 11/645,382

(22) Filed: Dec. 26, 2006

(65) Prior Publication Data
US 2007/0145368 A1 Jun. 28, 2007

(30) Foreign Application Priority Data
Dec. 28, 2005 (JP) .............................. 2005-379545

(51) Int. Cl.
*H03B 5/32* (2006.01)
(52) U.S. Cl. .......................... 331/158; 331/46; 331/48; 331/49
(58) Field of Classification Search ................... 331/46, 331/48, 49, 158; 310/314, 318
See application file for complete search history.

(56) References Cited
U.S. PATENT DOCUMENTS
6,777,613 B2 * 8/2004 Okazaki ..................... 174/539
6,778,023 B2 * 8/2004 Christensen ................. 331/16

FOREIGN PATENT DOCUMENTS
JP 2002-237566 8/2002
JP 2002-290153 10/2002
JP 2004-179706 6/2004

* cited by examiner

*Primary Examiner*—Joseph Chang
*Assistant Examiner*—Jeffrey Shin
(74) *Attorney, Agent, or Firm*—Scott D. Wofsy; Edwards Angell Palmer & Dodge LLP

(57) ABSTRACT

The present invention relates to a two-frequency switchover type crystal oscillator in which first and second IC chips and first and second crystal resonators are connected to wiring patterns of a circuit substrate to form first and second oscillation circuits, and the first and second oscillation circuits are selectively operated in accordance with a selection mechanism; a two-frequency switchover type crystal oscillator in which surfaces opposite to circuit function surfaces of the first and second IC chips are connected to form a two-stage structure; IC terminals of the circuit function surface of the first IC chip are directly connected both electrically and mechanically to the wiring patterns; and IC terminals of the circuit function surface of the second IC chip are connected electrically by wire bonding to the wiring patterns; wherein those wiring patterns of the wiring patterns that are connected to power source, output, and ground terminals of the first and second IC chips are connected in common with respect to the first and second oscillation circuits. This configuration reduces the mounting surface area of the first and second IC chips, facilitating the wiring patterns thereof, thus making it possible to provide a two-frequency switchover oscillator in which the surface area of the external plan view is reduced.

5 Claims, 4 Drawing Sheets

TWO-FREQUENCY SWITCHOVER TYPE CRYSTAL OSCILLATOR

BACKGROUND OF THE INVENTION

1. Field of the Invention

The present invention relates to a two-frequency switchover type crystal oscillator (hereinafter called as "two-frequency switchover oscillator") and, in particular, to a two-frequency switchover oscillator in which the mounting surface area thereof has been reduced.

2. Background of Art

Crystal oscillators are often used as frequency or time reference sources in various different electronic appliances, because of the high degree of stability of the frequency thereof. One such crystal oscillator is a two-frequency switchover oscillator in which switching between a first crystal oscillator and a second crystal oscillator is done by a select signal, to output different oscillation frequencies. This type of two-frequency switchover oscillator could be used in a transmitter or the like, in which case the oscillation frequencies thereof would be 622 MHz and 644 MHz, by way of example.

DESCRIPTION OF RELATED ART

Circuit diagrams that illustrate a typical two-frequency switchover oscillator of the prior art are shown in FIGS. 4A and 4B, where FIG. 4A is a wiring pattern diagram and connection diagram thereof and FIG. 4B is a circuit diagram of the first oscillation circuit thereof, by way of example.

The two-frequency switchover oscillator shown in FIG. 4A that is an example of the prior art is formed of first and second oscillation circuits 1a and 1b and a switchover mechanism 2 that selectively causes those oscillation circuits 1a and 1b to operate. These are mounted on a substrate 6 on which is formed wiring patterns L1 to L6. The first and second oscillation circuits 1a and 1b are formed of first and second crystal resonators 3a and 3b and first and second IC chips 4a and 4b, respectively. The first and second IC chips 4a and 4b are configured so that at least circuit elements 5 that form the first and second oscillation circuits 1a and 1b are integrated together with the first and second crystal resonators 3a and 3b.

The circuit elements 5 are at least dividing capacitors 5a and 5b, a oscillation amplifier 5c, and a feedback resistor 5d, as shown in FIG. 4B. The dividing capacitors 5a and 5b form resonance circuits with the corresponding first and second crystal resonators 3a and 3b, and the oscillation amplifier 5c, which is formed of an inverter/amplifier element, feeds back and amplifies the oscillation frequency. The switchover mechanism 2 is formed of an inverter element 2a and first and second switching elements 2x and 2y. In this case, the inverter element 2a is formed of a separate element that is independent of the other components, which is known as a "discrete component". The switching elements 2x and 2y are configured of MOS-FETs, by way of example, which are integrated into the corresponding first and second IC chips 4a and 4b and are provided between a power source Vcc and the oscillation amplifier 5c.

The gates of the switching elements 2x and 2y are connected to the input and output sides of the inverter element 2a, as shown in FIG. 4A. This ensures that an external select signal S (Voltage level corresponding to 1 or 0, e.g., Vcc level, GND level) is inverted between the input and output sides so that one of the switching elements 2x and 2y is turned ON and the other is turned OFF. Thus power is passed through the oscillation amplifier 5c within one of the first and second IC chips 4a and 4b so that one of the oscillation circuits 1a and 1b is selectively operated.

Note that the circuit function surfaces of the IC chips 4a and 4b are provided with IC terminals formed of switching terminals that connect together at least a pair of crystal terminals; power source, output, and ground terminals; and the switching elements 2x and 2y of the inverter element 2a, although these are not shown in the figures. These IC terminals are then affixed by ultrasonic thermal crimping using bumps (very small terminal electrodes for thermal crimping, attached to the IC chip), to connect them electrically and mechanically to the wiring pattern. In this document, the wiring pattern for the power source of the inverter element 2a is omitted from FIGS. 4A and 4B (refer to Japanese Patent Laid-Open Publication No. 2002-290153, Japanese Patent Laid-Open Publication No. 2002-237566, and Japanese Patent Laid-Open Publication No. 2004-179706).

PROBLEMS OF PRIOR ART

However, since the first and second oscillation circuits 1a and 1b are disposed in parallel on the same substrate in the prior-art example of the two-frequency switchover oscillator which is configured as described above, it is necessary to form a wiring pattern for each of the first and second oscillation circuits 1a and 1b and also to affix each of the first and second IC chips 4a and 4b individually to wiring patterns. This raises problems in that the surface area for mounting the first and second IC chips 4a and 4b increases and the wiring patterns therefor become complicated, and also in that the surface area of the external plan view of the two-frequency switchover oscillator increases.

An objective of the present invention is to provide a two-frequency switchover oscillator in which the mounting surface area of the first and second IC chips is smaller, and also in which the wiring patterns are facilitated and the surface area of the external plan view is reduced.

SUMMARY OF THE INVENTION

The present invention is addressed to a technique of connecting IC chips in a vertical two-stage configuration, where the lower IC chip is directly connected both electrically and mechanically to wiring patterns on a circuit substrate whereas the upper IC chip is connected (mounted) electrically thereto (refer to Japanese Patent Laid-Open Publication No. 2002-237566 by way of example), in which this mounting technique is applied to a two-frequency switchover oscillator and the wiring patterns of the first and second oscillation circuits can be used in common.

The present invention relates to a two-frequency switchover type of crystal oscillator in which first and second IC chips and first and second crystal resonators are connected to wiring patterns of a circuit substrate to form first and second oscillation circuits, and the first and second oscillation circuits are selectively operated in accordance with a selection mechanism; a two-frequency switchover type of crystal oscillator in which surfaces opposite to circuit function surfaces of the first and second IC chips are connected to form a two-stage structure; IC terminals of the circuit function surface of the first IC chip are directly connected both electrically and mechanically to the wiring patterns; and IC terminals of the circuit function surface of the second IC chip are connected electrically by wire bonding to the wiring patterns; wherein those wiring patterns of the wiring patterns that are connected to power source, output, and ground terminals of the first and second IC chips are connected in common with respect to the first and second oscillation circuits.

The above-described configuration of the present invention arranges the first and second IC chips in a two-stage structure, where the wiring patterns connected to the power source, output, and ground terminals of the first and second IC chips are in common with respect to the first and second oscillation circuits. It is therefore possible to make the mounting surface area of the first and second IC chips smaller, and also facilitate the formation of the wiring patterns, so that the surface area of the external plan view of the two-frequency switchover oscillator can be made as small as possible.

With the present invention, the selection mechanism is formed of an inverter element that inverts an external signal between input and output sides thereof and switching elements that are connected between the input and output sides of the inverter element and are integrated into the first and second IC chips. Since this enables selection of the operation of the first and second IC chips by an external signal, the oscillation of the first and second oscillation circuits can be switched easily.

In addition, the present invention ensures that the circuit function surface of the first IC chip is affixed by ultrasonic thermal crimping to the mounting substrate, using bumps. This enables the electrical and mechanical connection of the first IC chip to the wiring patterns (called as "flip-chip bonding").

BRIEF DESCRIPTION OF THE DRAWINGS

FIG. 1 is illustrative of an embodiment of a two-frequency switchover oscillator of the present invention, where

FIG. 4 is illustrative of a prior-art example of a two-frequency switchover oscillator, where

PREFERRED EMBODIMENTS OF THE INVENTION

Figure 1A:
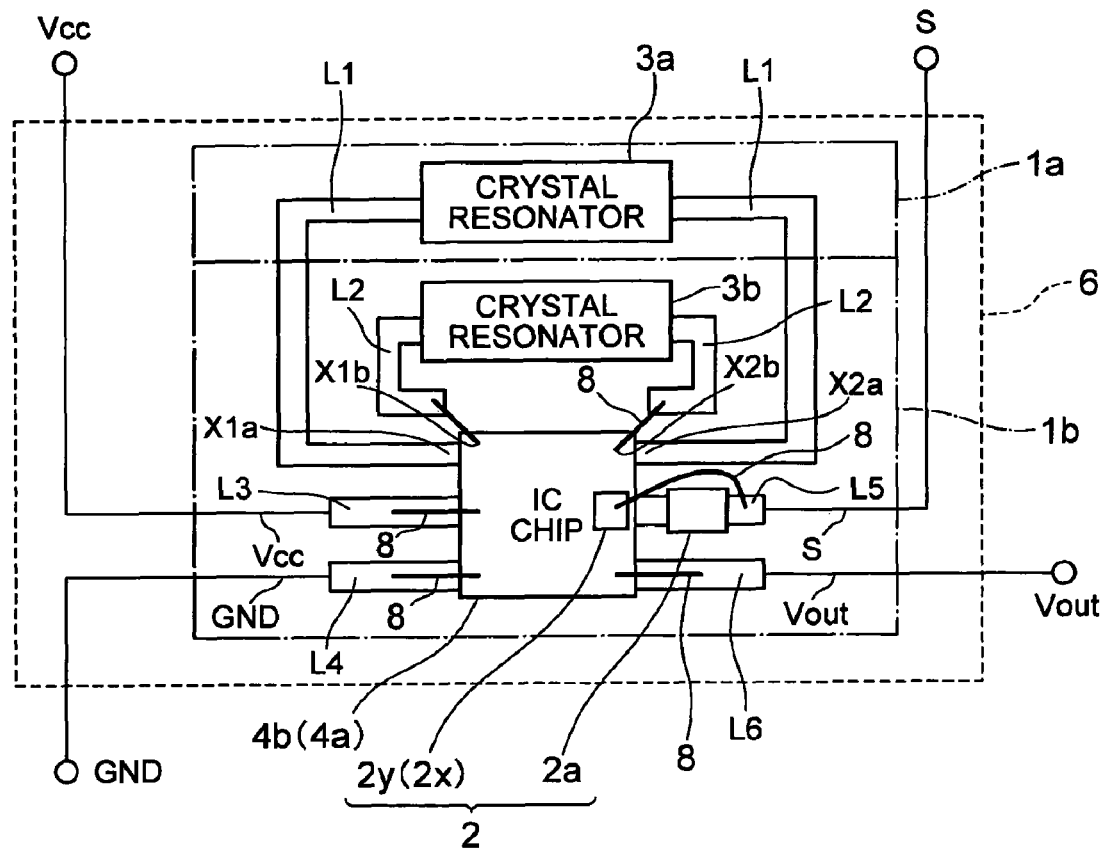
FIG. 1A is a wiring pattern diagram and connection diagram thereof and FIG. 1B is a partial section through essential components thereof (IC chip and circuit substrate)
Figure 1B:
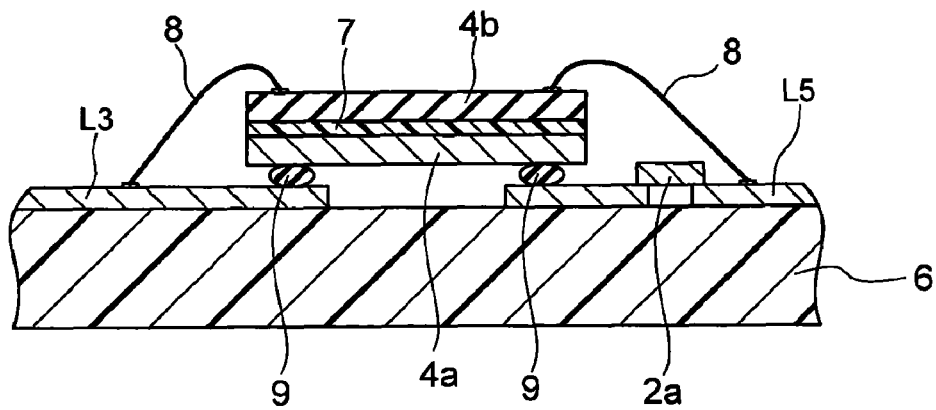

An embodiment of a two-frequency switchover oscillator in accordance with the present invention is shown in FIG. 1, where FIG. 1A is a wiring pattern diagram and connection diagram thereof and FIG. 1B is a partial section through essential components thereof (IC chip and circuit substrate).

This two-frequency switchover oscillator of the present invention has at least the first and second oscillation circuits 1a and 1b mounted onto the substrate 6 on which is formed the wiring patterns L1 to L6, as shown in FIG. 1A. The first and second oscillation circuits 1a and 1b are formed of the first and second crystal resonators 3a and 3b, the first and second IC chips 4a and 4b into which are integrated at least the circuit elements 5 (See FIG. 2, dividing capacitors 5a, 5b, an oscillation amplifier 5c and a feedback resistor 5d) for oscillation, and the switchover mechanism 2 having the inverter element 2a and the switching elements 2x and 2y. The inverter element 2a is a discrete component that is made to be independent of the other components, whereas the switching elements 2x and 2y are each integrated into the corresponding first and second IC chips 4a and 4b.

In this case, the surfaces of the first and second IC chips 4a and 4b that are opposite to the circuit function surface thereof that has IC terminals are affixed together by an adhesive 7. The IC terminals of the first IC chip 4a (in other words, a pair of crystal terminals and power source, output, ground, and switchover terminals) are directly connected both electrically and mechanically to the corresponding wiring patterns L1 to L6. For example, the fixing could be done by flip-chip bonding by ultrasonic thermal crimping, using bumps 9 (very small electrodes for thermal crimping, attached to the IC chip), as shown in FIG. 1B.

The IC terminals of the second IC chip 4b are then connected electrically to the wiring patterns by wire bonding using metal wiring 8. In this case, the power source, output, ground, and switchover terminals of the IC terminals are connected in common to the wiring patterns L1 to L6 that are connected to the first IC chip (excluding the pair of crystal terminals X1 (X1a, X1b) and X2 (X2a, X2b)).

The two terminals of each of the first and second crystal resonators 3a and 3b and the crystal terminals X1 and X2 of each of the first and second IC chips 4a and 4b are then connected by their own wiring patterns, to form the first and second oscillation circuits 1a and 1b.

Note that the present invention ensures that after the first IC chip 4a has been affixed by ultrasonic thermal crimping onto the substrate 6, the second IC chip 4b is affixed by the adhesive 7 on top of the first IC chip 4a, as shown in FIG. 1B. This facilitates the ultrasonic thermal crimping of the first IC chip 4a.

Figure 2:
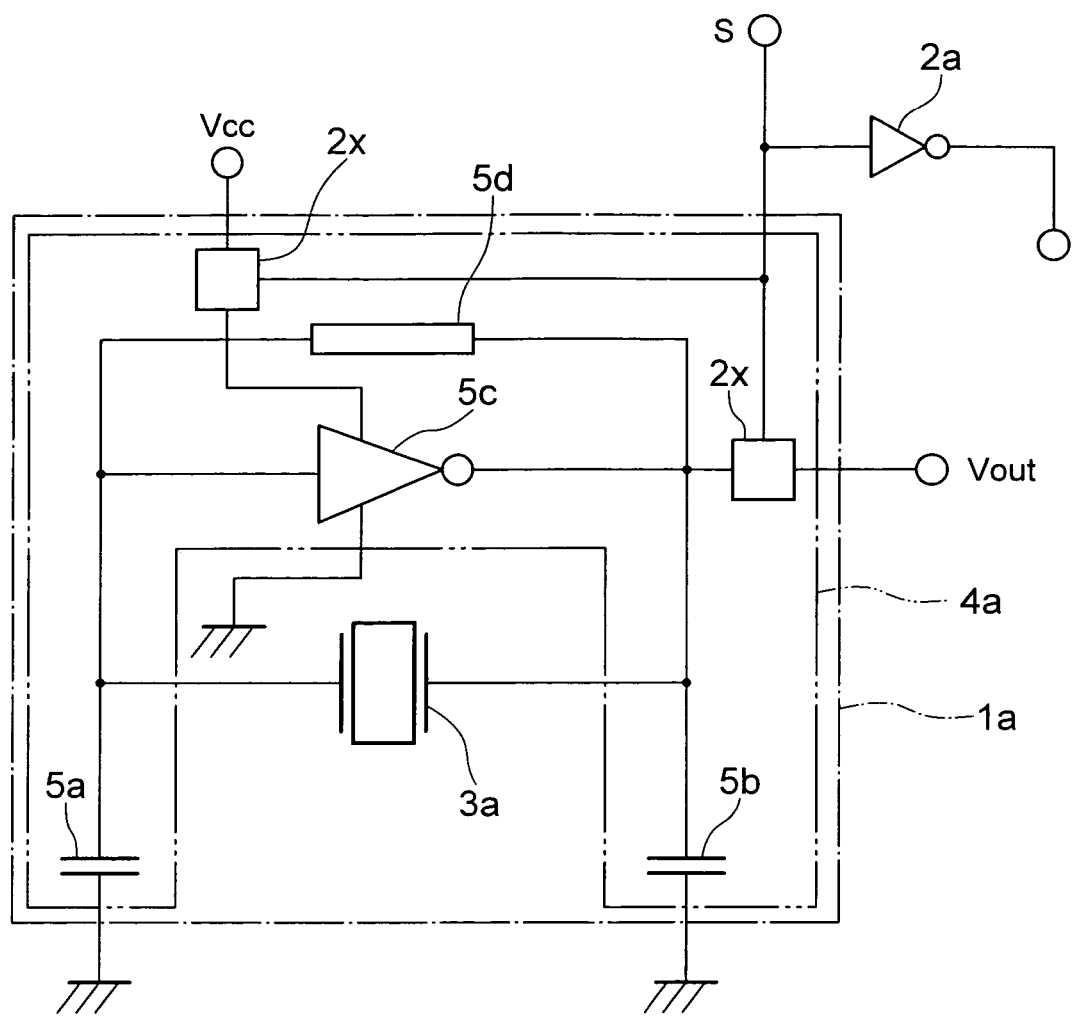
FIG. 2 is a circuit diagram illustrating the embodiment of the two-frequency switchover oscillator of the present invention.

In this case, the switching element 2x (or 2y) of the switchover mechanism 2 is provided between the power source side (Vcc) and the output side (Vout), as shown in FIG. 2. This reliably prevents electrical interference of the first and second oscillation circuits 1a and 1b, ensuring that the oscillation characteristics thereof can be maintained independently.

The above-described configuration of the present invention places the first and second IC chips 4a and 4b in a two-stage structure that is connected to the wiring patterns by flip-chip bonding and wire bonding. The power source, output, ground, and switchover terminals of the first and second IC chips 4a and 4b are then connected to the common wiring patterns L1 to L6. Thus the mounting surface area of the first and second IC chips 4a and 4b can be made smaller and the wiring patterns can be facilitated. This makes the surface area of the external plan view of the substrate 6 smaller, thus helping promote a smaller size of the entire two-frequency switchover oscillator.

Figure 3:
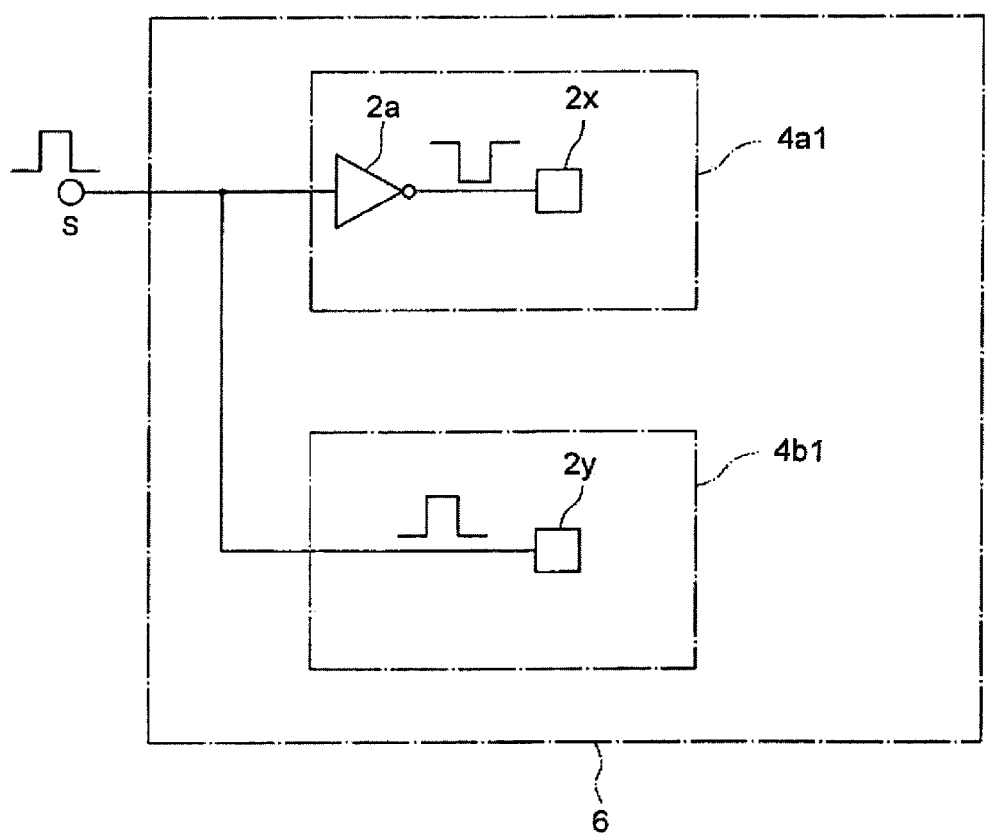
FIG. 3 is a partial circuit diagram illustrating another embodiment of a two-frequency switchover oscillator of the present invention.
Figure 4A:
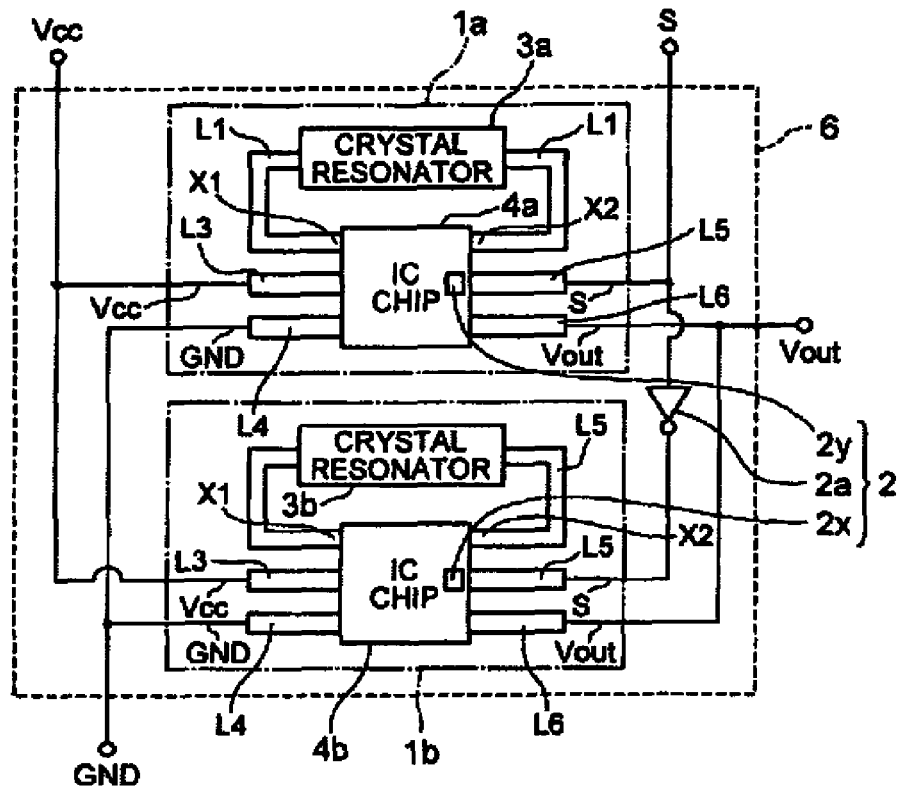
FIG. 4A is a wiring pattern diagram and connection diagram thereof and FIG. 4B is a circuit diagram thereof.
Figure 4B:
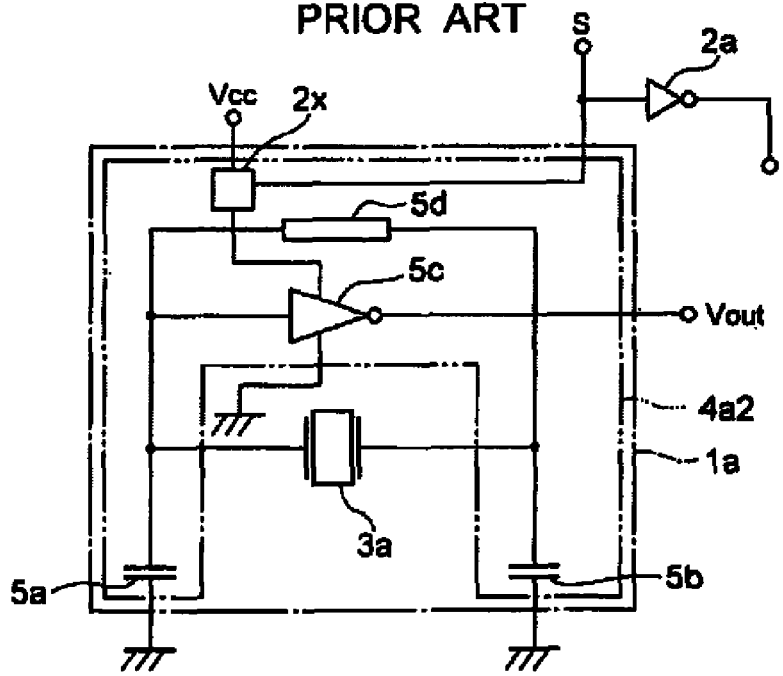

In the embodying example of the present invention as described above, the inverter element 2a of the switchover mechanism 2 shown in FIG. 1A is provided as a discrete component outside of the first and second IC chips 4a and 4b, but the inverter element 2a could equally well be integrated into the first IC chip 4a, with the configuration being such that a select signal from the switchover terminal S is inverted therein whereas the select signal is input unchanged to the second IC chip 4b, as shown in FIG. 3 by way of example.

With this embodying example, signals of mutually opposite levels are input to the switching elements 2x, 2y of the first and second IC chips 4a and 4b, respectively, so that if the first IC chip 4a is turned OFF, the second IC chip 4b is turned ON. Since the inverter element 2a is not a discrete component and is incorporated into the IC chip in such a case, the mounting surface area can be made even smaller. It should be noted that since the first and second IC chips 4a and 4b in this case would have to be two different types of IC chip having different shapes, the previous embodying example might be preferable from consideration of fabrication costs, etc.

In addition, the oscillation amplifier 5c of the present invention is an inverter/amplifier element connected between the input and output sides of each of the first and second crystal resonators 3a and 3b, but it could equally well be a transistor amplification element instead. Since each of the first and second crystal resonators 3a and 3b could be connected between the base and the ground of the transistor in such a case, by way of example, the number of IC terminals can be reduced.

In the embodying example shown in FIG. 2, the switching element 2x (or 2y) of the switchover mechanism 2 is provided between the power source side (Vcc) and the output side (Vout), but the present invention is not restricted to that embodying example, provided the resonance of each oscillation circuit can be halted or made to operate individually.

What is claimed is:

1. In a two-frequency switchover type crystal oscillator in which first and second IC chips are connected to common wiring patterns of a circuit substrate and to first and second crystal resonators to form first and second oscillation circuits, and said first and second oscillation circuits are selectively operated in accordance with a selection mechanism; a two-frequency switchover type crystal oscillator in which surfaces opposite to circuit function surfaces of said first and second IC chips are connected to form a two-stage structure; IC terminals of the circuit function surface of said first IC chip are directly connected both electrically and mechanically to said wiring patterns; and IC terminals of the circuit function surface of said second IC chip are connected electrically by wire bonding to said wiring patterns; wherein those wiring patterns of said wiring patterns that are connected to power source, output, and ground terminals of said first and second IC chips are connected in common with respect to said first and second oscillation circuits, wherein said power source, said output and said ground terminal of said first IC chip are directly connected both electrically and mechanically to said wiring pattern of said power source, said output and said ground terminal, wherein said power source, said output and said ground terminal of said second IC chip are connected electrically by wire bonding to said common wiring pattern of said power source, said output and said ground terminal, and wherein said selection mechanism is formed of an inverter element that inverts an external signal between input and output sides thereof and switching elements that are connected between the input and output sides of said inverter element.

2. The two-frequency switchover type crystal oscillator according to claim 1, wherein said switching elements are integrated into said first and second IC chips.

3. The two-frequency switchover type crystal oscillator according to claim 1, wherein said switching elements are integrated into each of said first IC chip and said second IC chip.

4. The two-frequency switchover type crystal oscillator according to claim 1, wherein said second IC chip is carried by said first IC chip.

5. The two-frequency switchover type crystal oscillator according to claim 4, wherein said second IC chip is affixed to the first IC chip by an adhesive.

* * * * *